United States Patent
Yamashita

(10) Patent No.: US 8,008,630 B2
(45) Date of Patent: Aug. 30, 2011

(54) ION IMPLANTATION APPARATUS AND METHOD OF CORRECTING DEVIATION ANGLE OF ION BEAM

(75) Inventor: Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 349 days.

(21) Appl. No.: 12/305,594

(22) PCT Filed: Jun. 22, 2007

(86) PCT No.: PCT/JP2007/062578
§ 371 (c)(1),
(2), (4) Date: Dec. 18, 2008

(87) PCT Pub. No.: WO2008/001685
PCT Pub. Date: Jan. 3, 2008

(65) Prior Publication Data
US 2009/0289193 A1    Nov. 26, 2009

(30) Foreign Application Priority Data

Jun. 26, 2006  (JP) ................. 2006-175127
May 18, 2007  (JP) ................. 2007-133001

(51) Int. Cl.
*G21K 1/08* (2006.01)
*H01J 3/14* (2006.01)
*H01J 3/26* (2006.01)
*H01J 49/42* (2006.01)
*A61N 5/00* (2006.01)
*G21G 5/00* (2006.01)

(52) U.S. Cl. ............. 250/396 R; 250/492.21; 250/492.2

(58) Field of Classification Search ........... 250/396 ML, 250/396 R, 492.3, 492.21, 492.2, 492.22
See application file for complete search history.

(56) References Cited

U.S. PATENT DOCUMENTS
5,177,366 A    1/1993  King et al.
(Continued)

FOREIGN PATENT DOCUMENTS
JP    06-068837    3/1994
(Continued)

OTHER PUBLICATIONS

International Search Report (English & Japanese) for PCT/JP2007/062578 mailed Sep. 18, 2007 (10 pages).
(Continued)

*Primary Examiner* — Robert Kim
*Assistant Examiner* — Brooke Purinton
(74) *Attorney, Agent, or Firm* — Osha • Liang LLP

(57) ABSTRACT

To increase a transport efficiency of an ion beam by correcting Y-direction diffusion caused by the space charge effect of the ion beam between an ion beam deflector, which separates the ion beam and neutrons from each other, and a target. An ion implantation apparatus has a beam paralleling device that bends an ion beam scanned in an X direction by magnetic field to be parallel and draws a ribbon-shaped ion beam. The beam paralleling device serves also as an ion beam deflector that deflects the ion beam by magnetic field to separates neutrons from the ion beam. In the vicinity of an outlet of the beam paralleling device, there is provided an electric field lens having a plurality of electrodes opposed to each other in a Y direction with a space for passing the ion beam and narrowing the ion beam in the Y direction.

12 Claims, 8 Drawing Sheets

U.S. PATENT DOCUMENTS

| | | |
|---|---|---|
| 6,313,474 B1 | 11/2001 | Iwasawa et al. |
| 6,930,316 B2 * | 8/2005 | Nishihashi et al. ...... 250/492.21 |
| 6,998,625 B1 * | 2/2006 | McKenna et al. ........ 250/492.21 |
| 2003/0183763 A1 * | 10/2003 | Bertsche ................... 250/396 R |
| 2003/0183780 A1 | 10/2003 | Sano et al. |
| 2006/0016992 A1 * | 1/2006 | Sato et al. .................... 250/311 |
| 2006/0072427 A1 * | 4/2006 | Kanda et al. ................. 369/125 |
| 2006/0113465 A1 | 6/2006 | Kabasawa et al. |
| 2007/0114455 A1 * | 5/2007 | Naito et al. .............. 250/492.21 |
| 2008/0035856 A1 * | 2/2008 | Yamashita .................... 250/398 |
| 2010/0219352 A1 * | 9/2010 | Kreckel et al. ............ 250/396 R |

FOREIGN PATENT DOCUMENTS

| | | |
|---|---|---|
| JP | 08-115701 | 5/1996 |
| JP | 3387488 | 1/2003 |
| JP | 3414380 | 4/2003 |
| JP | 2003-288857 | 10/2003 |
| JP | 3567749 | 6/2004 |
| JP | 2005-195417 | 7/2005 |
| JP | 2006-156247 | 6/2006 |
| JP | 2007-220522 | 8/2007 |

OTHER PUBLICATIONS

Written Opinion of ISA (Japanese) for PCT/JP2007/062578 mailed Sep. 18, 2007 (5 pages).

esp@cenet patent abstract for JP2007220522 dated Aug. 30, 2007 (1 page).

Patent Abstracts of Japan 08-115701 dated May 7, 1996 (1 page).

Patent Abstracts of Japan 2005-195417 dated Jul. 21, 2005 (1 page).

Patent Abstracts of Japan 2002-170516 dated Jun. 14, 2002.

Patent Abstracts of Japan 2002-150991 dated May 24, 2002.

* cited by examiner

ION IMPLANTATION APPARATUS AND METHOD OF CORRECTING DEVIATION ANGLE OF ION BEAM

TECHNICAL FIELD

The present invention relates to an ion implantation apparatus that irradiates a target with a ribbon-shaped ion beam (sheet-shaped or band-shaped) in which an X-direction size in an X direction is larger than a size in a Y direction orthogonal to the X direction to implant ions, and more particularly, to an ion implantation apparatus having an ion beam deflector that deflects an ion beam in an energy state irradiating a target by magnetic field or electric field to separate the ion beam and neutrons from each other and to a method of correcting a deviation angle of an ion beam in the ion implantation apparatus.

BACKGROUND ART

An example of such a kind of conventional ion implantation apparatus is shown in FIG. 10. An ion implantation apparatus equivalent thereto is described, for example, in Patent Document 1. In the present specification and drawings, a traveling direction of an ion beam 4 in design is a Z direction, and two directions substantially orthogonal to each other in a plane substantially orthogonal to the Z direction are an X direction and a Y direction. For example, the X direction and the Z direction are horizontal directions, and the Y direction is a vertical direction. In the other words, such a "traveling direction in design" is a predetermined traveling direction, that is, a traveling direction for original travel.

This ion implantation apparatus mass-separates an ion beam 4 generated from an ion source 2 and having a small sectional shape as foundation of a ribbon-shaped ion beam through a mass separator 6, accelerates or decelerates it through an accelerator/decelerator 8, energy-separates it through an energy-separator 10, scans it in the x direction through a scanner 12, forms it into a parallel beam through a beam paralleling device 14, irradiates a target (e.g., semiconductor substrate) 24 supported to a holder 26, and implants ions into the target 24. The target 24 is mechanically reciprocating scanned (reciprocating driven) together with the holder 26 in a direction along the Y direction by a target driving device 28 within an emission area irradiated with the ion beam 4 from the beam paralleling device 14.

The beam paralleling device 14 cooperates with the scanner 12 that scans the ion beam 4 by magnetic field or electric field (in this example, magnetic field), bends it to be substantially parallel to a reference axis 16 by magnetic field or electric field (in this example, magnetic field) to form it into a parallel beam, and makes the ribbon-shaped ion beam 4 (see FIG. 11) in which a size in the X direction is larger than a size in the Y direction orthogonal to the X direction. Although the ion beam 4 has the ribbon shape, it does not means the size in the Y direction is as thin as paper. For example, the size in the X direction of the ion beam 4 is about 35 cm to 50 cm, and the size in the Y direction is about 5 cm to 10 cm. The beam paralleling device 14 is called as a beam paralleling magnet in case of using magnetic field described in the present example.

In the example of the ion implantation apparatus, the target 24 is irradiated with the ribbon-shaped ion beam 4 through the scanning in the X direction. However, the ribbon-shaped ion beam 4 may be generated from the ion source 2, and then the target 24 may be irradiated with the ribbon-shaped ion beam 4 without the scanning in the X direction.

Patent Document 1: Japanese Patent Laid-Open Publication No. 8-115701 (paragraph 0003, FIG. 1)

DISCLOSURE OF THE INVENTION

Problem that the Invention is to Solve

A transport route of the ion beam 4 is within a vacuum chamber (not shown) and is kept in a vacuum atmosphere. However, there is inevitably a little gas such as residual gas and outgas in the transport route of the ion beam 4.

The ion beam 4 collides with molecules of the gas, thereby generating neutrons. When the neutrons are made incident to the target 24, a bad influence occurs, for example, uniformity in distribution of the implantation amount deteriorates or error of the implantation amount occurs.

To prevent such a problem, it is necessary that the ion beam 4 in an energy state (in the other words, a final energy state after passing through the accelerator/decelerator 8) irradiating the target 24 is deflected by magnetic field or electric field of an ion beam deflector disposed in the vicinity of the target 24, the deflected ion beam 4 and the neutrons 18 that is not deflected and goes straight are separated from each other, thereby preventing the neutrons 18 from being made incident to the target 24. The beam paralleling device 14 serves also as the ion beam deflector.

To prevent the neutrons 18 separated by the beam paralleling device 14 from being made incident to the target 24, a predetermined distance L1 is necessary between the outlet of the beam paralleling device 14 and the target 24. The reason is that the neutrons 18 are made incident to the target 24 when the distance L1 is insufficient. When the ion beam 4 is largely deflected by the beam deflector 14, it is possible to reduce the distance L1. However, in such a case, there is a problem that the beam paralleling device 14 and the voltage source thereof have a large size. In addition, as the target 24 gets larger, the larger distance L1 is necessary. For example, the distance L1 of about 70 cm to 80 cm is necessary.

The ion beam 4 is diverged by the space charge effect even in the course of transporting the ion beam 4 between the beam paralleling device 14 and the target 24. From the viewpoint of reducing an ion implantation depth, improving a throughput of the apparatus and miniaturization of semiconductor devices formed on the target 24, it is desired that the ion beam 4 irradiating the target 24 has a low energy and a high current. However, as the ion beam 4 has the low energy and the high current, the ion beam 4 is more largely diverged by the space charge effect. In addition, as the distance L1 gets larger, the ion beam 4 is more largely diverged.

The divergence of the ion beam 4 occurs in both of the X and Y directions. Since the X-direction size of the ion beam 4 is sufficiently larger than the Y-direction size as described above, a bad influence caused by the Y-direction divergence is greater than the other. Thus, hereinafter, attention is paid to the Y-direction divergence.

When the ion beam 4 is diverged in the Y direction, a part of the ion beam 4 in the Y direction is cut by a vacuum chamber surrounding the route of the ion beam 4 or a mask for shaping the ion beam 4, thereby decreasing a transport efficiency of the ion beam 4 to the target 24.

For example, an opening 22 for passing the ion beam 4 is formed between the beam paralleling device 14 and the target 24, as shown in FIGS. 10 and 11 and as described in Japanese Patent Publication No. 3567749, and a mask 20 for shaping the ion beam 4 is formed. Accordingly, unnecessary ends of the ion beam 4 in the Y direction are cut by the mask 20, and it is possible to reduce a distance L2 from the ion beam 4 to the target 24.

When the ion beam 4 is diverged in the Y direction by the space charge effect, a cutting ratio of the mask 20 becomes large. Accordingly, the amount of the ion beam 4 capable of passing through the mask 20 is reduced, thereby decreasing a transport efficiency of the ion beam 4.

Even in case where the ribbon-shaped ion beam 4 is generated from the ion source 2 and the target 24 is irradiated with the ribbon-shaped ion beam 4 without passing through the X-direction scanning, there is also the aforementioned problem.

A main object of the invention is to correct the Y-direction divergence of the ion beam caused by the space charge effect and to increase the transport efficiency of the ion beam, between the target and the ion beam deflector for separating the ion beam and the neutrons from each other.

SUMMARY OF THE INVENTION

An ion implantation apparatus according to the invention includes an electric field lens, which is disposed on a downstream side of an ion beam deflector separating an ion beam and neutrons from each other, which has a plurality of electrodes opposed to each other in a Y direction with a space for passing the ion beam, and which narrows the ion beam in the Y direction.

According to the ion implantation device, since it is possible to narrow the ion beam in the Y direction by the electric field lens, it is possible to increase the transport efficiency of the ion beam by correcting the Y direction divergence caused by the space charge effect of the ion beam, between the ion beam deflector separating the ion beam and the neutrons from each other and the target.

Another ion implantation apparatus according to the invention includes an electric field lens, which is disposed on a downstream side of an ion beam deflector separating an ion beam and neutrons from each other and an upstream side of the mask, which has a plurality of electrodes opposed to each other in a Y direction with a space for passing the ion beam, and which narrows the ion beam in the Y direction.

According to the ion implantation apparatus, since it is possible to narrow the ion beam in the Y direction by the electric field lens, it is possible to increase the transport efficiency of the ion beam by correcting the Y direction divergence caused by the space charge effect of the ion beam and by increasing the amount of the ion beam passing through an opening of the mask, between the ion beam deflector separating the ion beam and the neutrons from each other and the mask.

The electric field lens may have an inlet electrode, an intermediate electrode, and an outlet electrode arranged at a distance from one another in the traveling direction of the ion beam, each of the inlet electrode, the intermediate electrode, and the outlet electrode includes a pair of electrodes that are opposed to each other in the Y direction with a space for passing the ion beam therebetween and are substantially parallel to a plane of the ion beam, and the inlet electrode and the outlet electrode are electrically grounded.

The ion implantation apparatus may further include a direct-current voltage source that apples a direct-current voltage to the intermediate electrode, or the ion implantation apparatus may further include first and second direct-current voltage sources that apply direct-current voltages to a pair of electrodes constituting the intermediate electrode, respectively.

The ion implantation apparatus may further include a beam paralleling device that bends the ion beam scanned in the X direction into a parallel beam by magnetic field or electric field so as to be substantially parallel to a reference axis to draw the ribbon-shaped ion beam, the beam paralleling device may serve also as the ion beam deflector, and the electric field lens may be disposed in the vicinity of an outlet of the beam paralleling device.

The ion implantation apparatus may further include a plasma generating device that generates plasma and supplies the plasma to the vicinity of the upstream side of the target to suppress charge of the surface of the target caused by the irradiation of the ion beam, and the electric field lens may be disposed on the more upstream side than the plasma generating device.

A deviation angle may be corrected to decrease a Y-direction deviation angle of the ion beam, using the electric field lens.

According to a second aspect of the invention, since it is possible to narrow the ion beam in the Y direction by the electric field lens, it is possible to increase the transport efficiency of the ion beam by correcting the Y direction diffusion caused by the space charge effect of the ion beam and by increasing the amount of the ion beam passing through an opening of the mask, between the ion beam deflector separating the ion beam and the neutrons from each other and the mask.

According to a third aspect of the invention, since the electric field serves as a unipotential lens (in other words, Einzel lens), it is possible to obtain another advantage that it is possible to narrow the ion beam without changing energy of the ion beam.

According to a fourth aspect of the invention, in addition to the same effect as the third aspect of the invention, it is possible to obtain the following advantage. That is, since it is possible to apply direct-current voltages different from each other from the first and second direct-current voltage sources to a pair of electrodes constituting the intermediate electrode of the electric field lens, it is possible to adjust the Y-direction deviation angle of the ion beam.

According to a fifth aspect of the invention, since the electric field lens is disposed in the vicinity of an outlet of a beam paralleling device serving also as an ion beam deflector, it is possible to more efficiently narrow the ion beam at a preceding stage and thus it is possible to obtain another advantage that it is possible to more increase the transport efficiency of the ion beam.

According to a sixth aspect of the invention, since the electric field lens is disposed on the more upstream side than a plasma generating device, it is possible to supply electrons in plasma generated from the plasma generating device to a target without passing through the electric field lens. Therefore, even when the electric field lens is provided, it is easy to reduce the influence on the electrification suppressing effect of the surface of the target by the plasma generating device.

According to seventh and eighth aspects of the invention, it is possible to obtain the following advantage. That is, since it is possible to decrease the Y-direction deviation angle of the ion beam using the electric field lens, it is possible to reduce deviation of an incident angle of the ion beam to the target caused by inclination of an orbit of the ion beam, and further to reduce deviation of an ion implantation angle. In addition, since it is possible to prevent the ion beam from colliding with a structure or to increase the amount of the ion beam passing through the opening of the mask by straightening the orbit of the ion beam, it is possible to increase the transport efficiency of the ion beam.

According to a ninth aspect of the invention, since the deviation angle becomes substantially 0 degree, it is possible to more improve the advantages represented in the seventh and eighth aspect of the invention. That is, it is possible to prevent the deviation of the incident angle of the ion beam and further the deviation of the ion implantation angle, and more increase the transport efficiency of the ion beam.

BEST MODE FOR CARRYING OUT THE INVENTION

Figure 1:
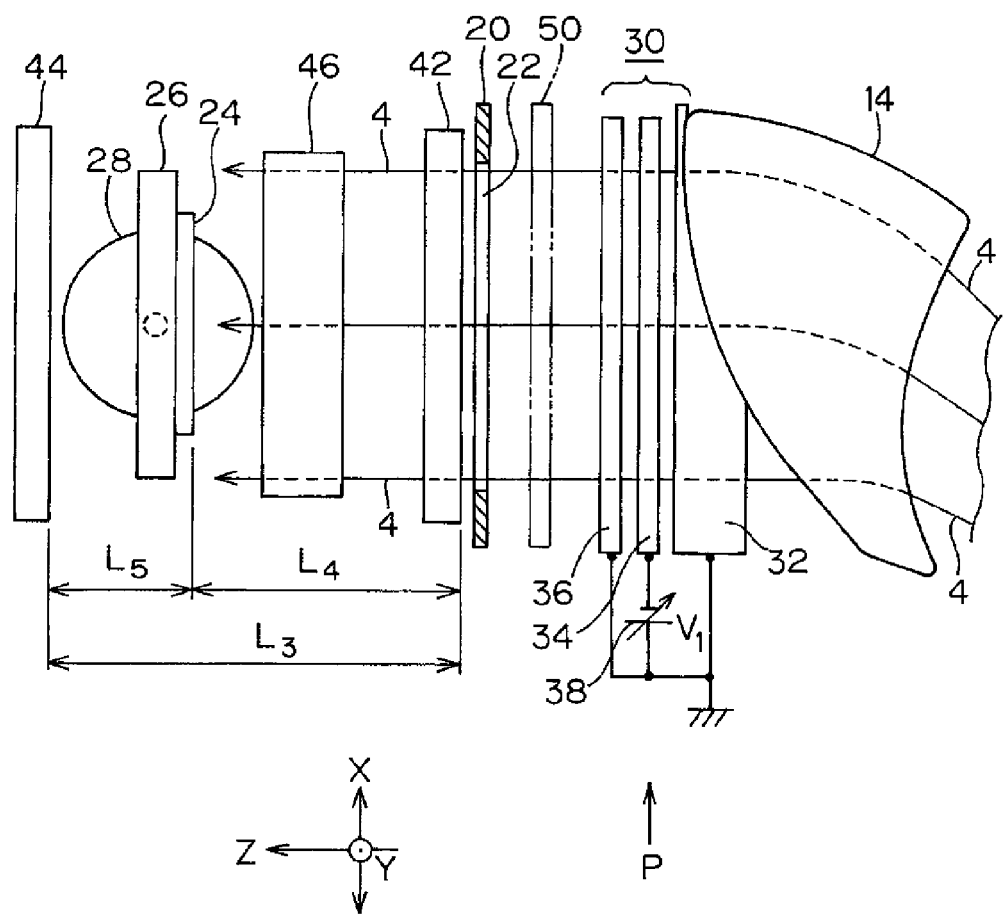
FIG. 1 is a plan view partially illustrating an embodiment of an ion implantation apparatus according to the invention.

FIG. 1 is a plan view partially illustrating an embodiment of an ion implantation apparatus according to the invention.

Figure 2:
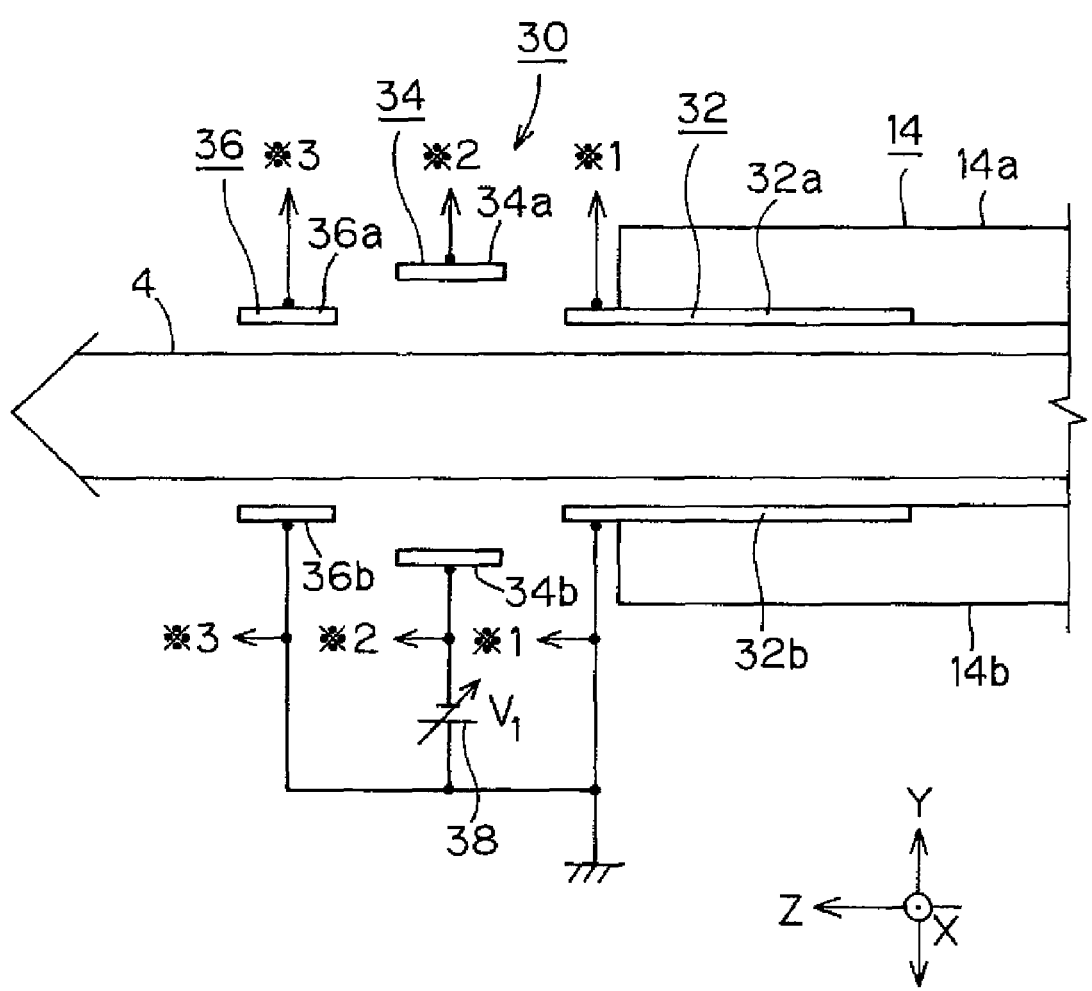
FIG. 2 is an enlarged front view illustrating a vicinity of an electric field lens shown in FIG. 1 as viewed in a direction indicated by an arrow P.
Figure 10:
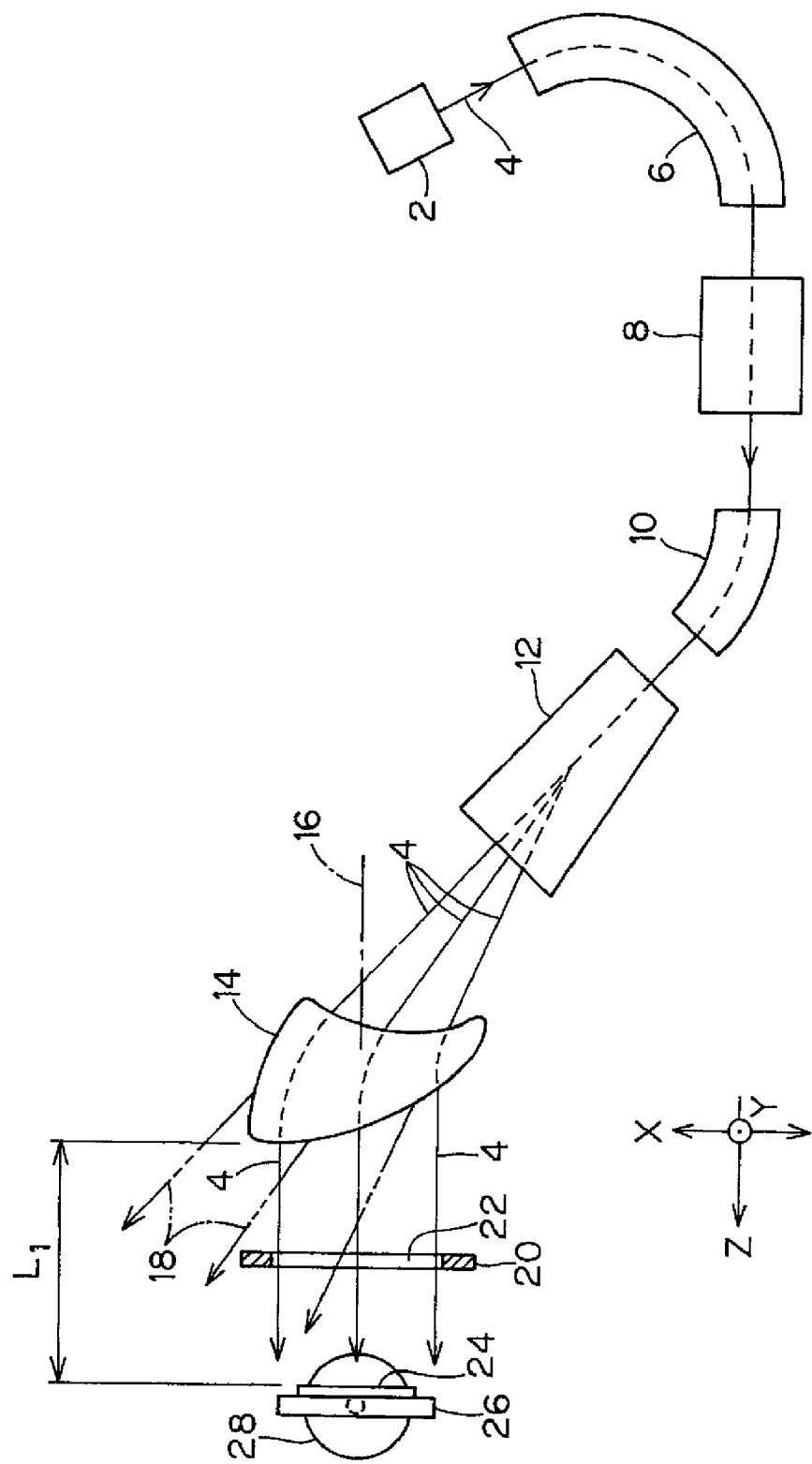
FIG. 10 is a plan view illustrating an example of a conventional ion implantation apparatus.
Figure 11:
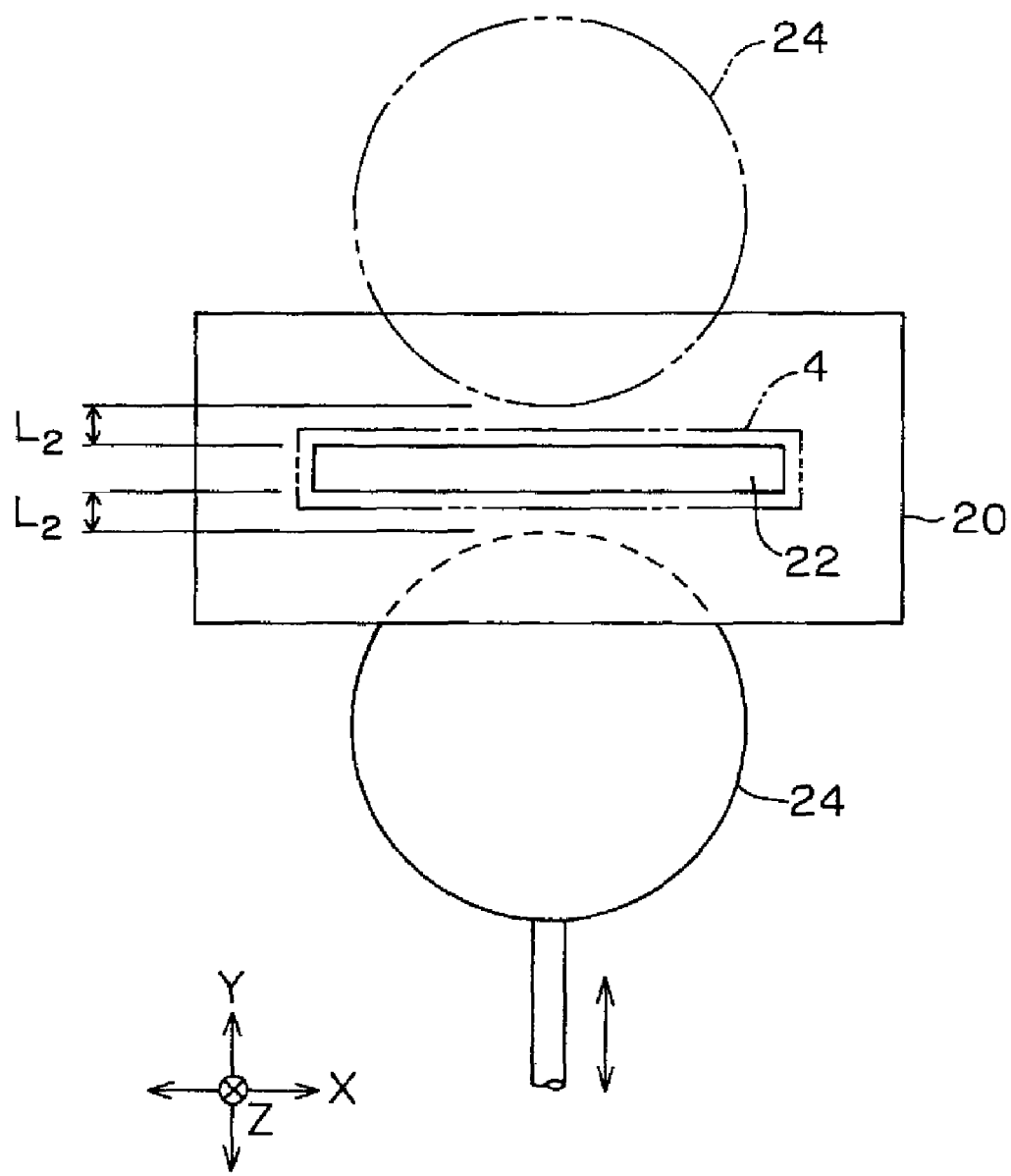
FIG. 11 is an enlarged front view illustrating a mask and a target shown in FIG. 10 as viewed in a traveling direction of an ion beam.

FIG. 2 is an enlarged front view illustrating the vicinity of an electric field lens in FIG. 1 as viewed in a direction indicated by an arrow P. The same reference numerals are given to the parts equal or equivalent to the conventional example shown in FIG. 10, and differences from the conventional example will be mainly described hereinafter.

The ion implantation apparatus has an electric field lens 30 disposed on an downstream side of a beam paralleling device 14 that separates an ion beam 4 and neutrons 18 (see FIG. 10) from each other and serves also as an ion beam deflector, and the electric field lens 30 narrows the ion beam 4 in the Y direction. More specifically, the electric field lens 30 is disposed in the vicinity of an outlet of the beams paralleling device 14.

The electric field lens 30 has an inlet electrode 32, an intermediate electrode 34, and an outlet electrode 36, which are arranged at a distance from one another in a traveling direction of the ion beam 4. The electrodes 32, 34, and 36 are substantially perpendicular to the Z direction that is the traveling direction of the ion beam 4. In other words, they are substantially parallel to the X direction. However, in the present embodiment, a side close to the inlet of the inlet electrode 32 (specifically, electrodes 32a and 32b constituting it, see FIG. 2) has a shape corresponding to a side close to the outlet of the beam paralleling device 14 (specifically, magnetic poles 14a and 14b, see FIG. 2). With such a configuration, the electric field lens 30 can be disposed closer to the outlet of the beam paralleling device 14. X-direction lengths of the inlet electrode 32, the intermediate electrode 34, and the outlet electrode 36 are larger than X-direction size of the ion beam 4.

As shown in FIG. 2, electrodes of the electrode 32, the intermediate electrode 34, and the outlet electrode 36 are opposed to each other in the Y direction with a space therebetween for passing the ion beam 4. The electrode 32, the intermediate electrode 34, and the outlet electrode 36 include a pair of electrodes 32a and 32b, a pair of electrodes 34a and 34b, and a pair of electrodes 36a and 36b, which are substantially parallel to a plane (plane along the X-Y plane) of a wide side of the ion beam 4, respectively. The electrodes 32a and 32b, the electrode 34a and 34b, and the electrodes 36a and 36b are electrically connected to each other by conductors.

In the present embodiment, inside surfaces of the electrodes 32a, 32b, 36a, and 36b are located on the substantially same plane as inside surfaces of the magnetic poles 14a and 14b of the beam paralleling device 14. The electrode 34a and 34b are located slightly out of the plane.

The inlet electrode 32 and the outlet electrode 36 (more specifically, electrodes 32a, 32b, 36a, and 36b constituting them) are electrically grounded. The intermediate electrode 34 (more specifically, electrodes 34a and 34b constituting it) is connected to a direct-current voltage source 38 for applying a negative or positive (negative in the embodiment shown in FIG. 1) direct-current voltage $V_1$ thereto.

In the electric field lens 30, the inlet electrode 32 and the outlet electrode 36 are kept at the same electric potential, and the intermediate electrode 34 is kept at an electric potential different from that of the inlet electrode 32 and the outlet electrode 36. Accordingly, the electric field lens 30 serves as a unipotential lens and narrows the ion beam 4. Therefore, it is possible to narrow the ion beam 4 in the Y direction without changing energy of the ion beam 4.

As a result, it is possible to increase a transport efficiency of the ion beam 4 to the target 24 by correcting Y-direction divergence of the ion beam 4 caused by the space charge effect, between the ion beam paralleling device 14 serving also as the ion beam deflector and the target 24, by the electric field lens 30.

More specifically, when the aforementioned mask 20 is provided as the present embodiment, it is possible to increase the transport efficiency of the ion beam 4 by correcting Y-direction divergence of the ion beam 4 caused by the space charge effect between the ion beam paralleling device 14 and the mask 20 and by increasing the amount of the ion beam 4 passing through the opening 22 of the mask 20.

When the electric field lens 30 is provided in the vicinity of the outlet of the beam paralleling device 14 as the present embodiment, it is possible to narrow the ion beam 4 by the electric field lens 30 in the initial step before or during the ion beam 4 is diverged in the Y direction by the space charge effect. Accordingly, it is possible to more effectively narrow the ion beam 4 by reducing loss of the ion beam 4. Therefore, it is possible to more increase the transport efficiency of the ion beam 4.

As an absolute value (magnitude) of the direct-current voltage $V_1$ applied with the direct-current voltage source 38 to the intermediate electrode 34 gets larger, it is possible to more strongly narrow the ion beam 4. The extent of narrowing the ion beam 4 is changed according to energy of the ion beam 4 at the time of passing through the electric field lens 30. As the energy of the ion beam 4 gets larger, a deflect effect which the direct-current voltage $V_1$ has on the ion beam 4 gets smaller. To strongly narrow the ion beam 4, it is necessary to increase the absolute value of the direct-current voltage $V_1$.

Figure 5:
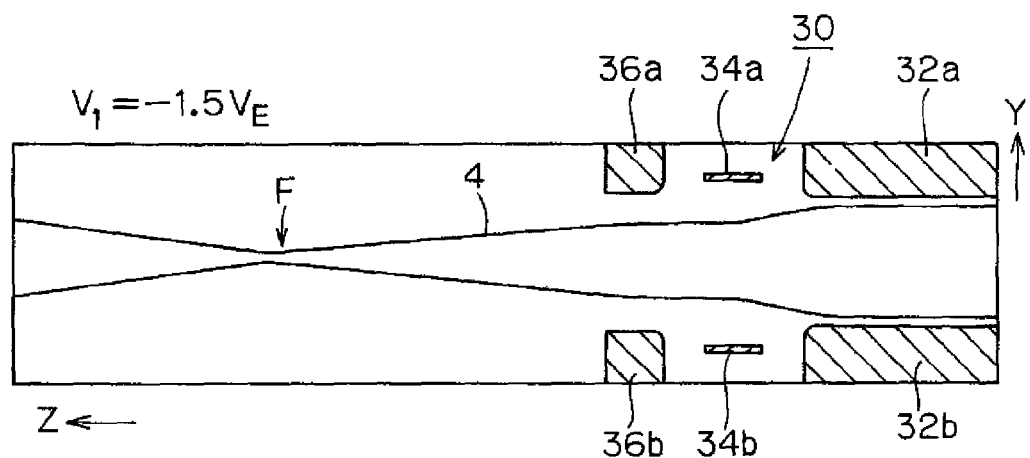
FIG. 5 is a view illustrating an example of a result of simulation of narrowing an ion beam in a Y direction using an electric field lens, in which a positive direct-current voltage is applied to an intermediate electrode.

FIG. 5 shows an example of a result of simulation of narrowing the ion beam 4 in the Y direction by the electric field lens 30 by applying a negative direct-current voltage $V_1$ to the intermediate electrode 34. The present example is a case where the ion beam 4 parallel to the Y direction is made incident to the electric field lens 30 and a case of $V_1 = -1.5V_E$. $V_E$ is a voltage corresponding to energy of the ion beam 4 (e.g., when energy of the ion beam 4 is 5 keV, a voltage $V_E$ is 5 kV). A minus sign (−) indicates that the direct-current voltage $V_1$ is a negative voltage (hereinafter, the same). It can be seen that a focus F of the ion beam 4 is formed on the downstream side of the electric field lens 30.

Although not shown, when the absolute value of the direct-current voltage $V_1$ is smaller than $1.5V_E$, the effect of narrowing the ion beam 4 is weakened. Accordingly, when the focus F becomes away from the electric field lens 30 and the absolute value is larger than $1.5V_E$, the effect of narrowing the ion beam 4 is more strengthened and thus the focus F gets close to the electric field lens 30. In case of the direct-current voltage $V_1$ having the same magnitude, when a diverged ion beam 4 that is not parallel beam is made incident to the electric field lens 30, the focus F becomes away from the electric field lens 30.

Figure 4:
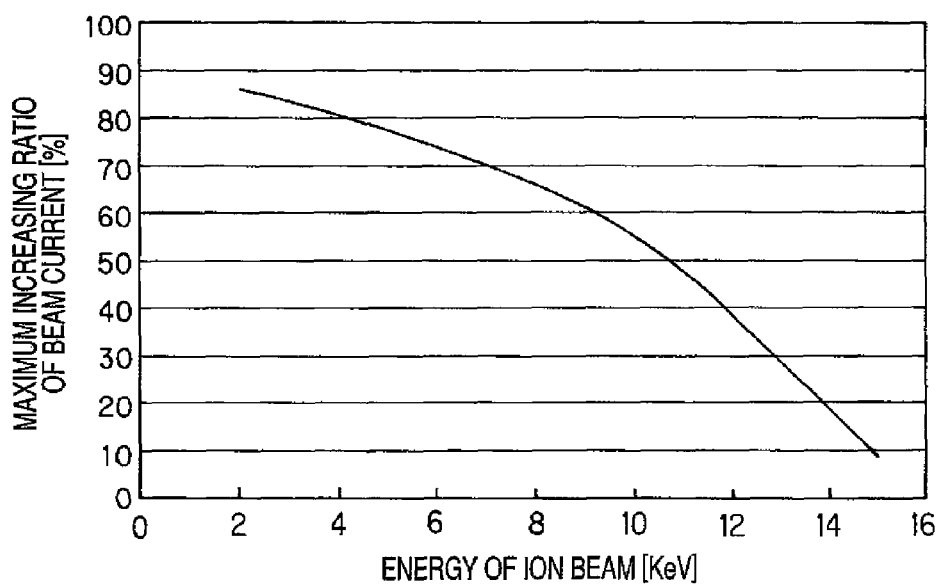
FIG. 4 a view illustrating an example of a result of measuring a maximum increasing ratio of ion beam current at a target in case of disposing an electric field lens, while changing an ion beam energy.

FIG. 4 shows an example of an example of a result of measuring a maximum increasing ratio of beam current of the ion beam 4 at the target 24 in case of disposing an electric field lens, while changing energy of the ion beam 4 at the time of passing through the electric field lens 30. The ion beam 4 is a kind of As+. An increasing ratio means a ratio of increasing ion beam current in case of disposing the electric field lens 30 when the other conditions are the same as compared with the case where the electric field lens 30 is not disposed. A maximum increasing ratio means an increasing ratio at the time of employing a direct-current voltage $V_1$ having a magnitude giving the maximum increasing ratio, since the increasing ratio is changed according to the magnitude of the direct-current voltage $V_1$.

From FIG. 4, it is can be seen that the maximum increasing ratio is large as the energy of the ion beam 4 is low. The reason is that as the energy of the ion beam 4 is low, the ion beam 4 is largely diverged by the space charge effect, the transport efficiency is decreased, the divergence of the ion beam 4 is suppressed by the electric field lens 30, and thus the effect of improving the transport efficiency becomes large.

A positive direct-current voltage $V_1$ may be applied to the intermediate electrode 34 of the electric field lens 30, reversing the polarity of the direct-current voltage source 38. In this case, the electric field lens 30 serves as the unipotential lens and it is possible to narrow the ion beam 4 in the Y direction without changing the energy thereof.

Figure 6:
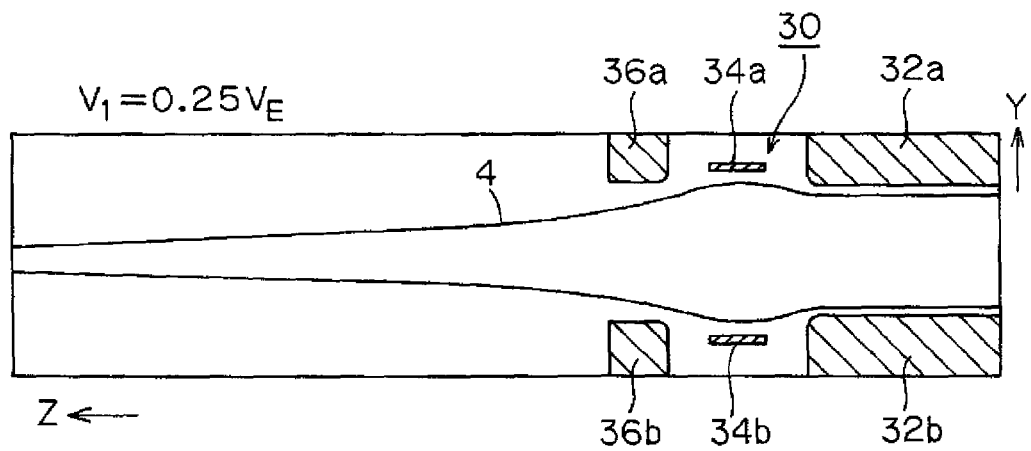
FIG. 6 is a view illustrating an example of a result of simulation of narrowing an ion beam in a Y direction using an electric field lens, in which a negative direct-current voltage is applied to an intermediate electrode.

FIG. 6 shows an example of a result of simulation of narrowing the ion beam 4 in the Y direction by the electric field lens 30 by applying a positive direct-current voltage $V_1$ to the intermediate electrode 34. In the present example is a case of $V_1 = 0.25V_E$.

Although not shown, when the magnitude of the direct-current voltage $V_1$ is smaller than $0.25V_E$, the effect of narrowing the ion beam 4 is weakened. When the magnitude is larger than $0.25V_E$, the effect of narrowing the ion beam 4 is strengthened.

Figure 7:
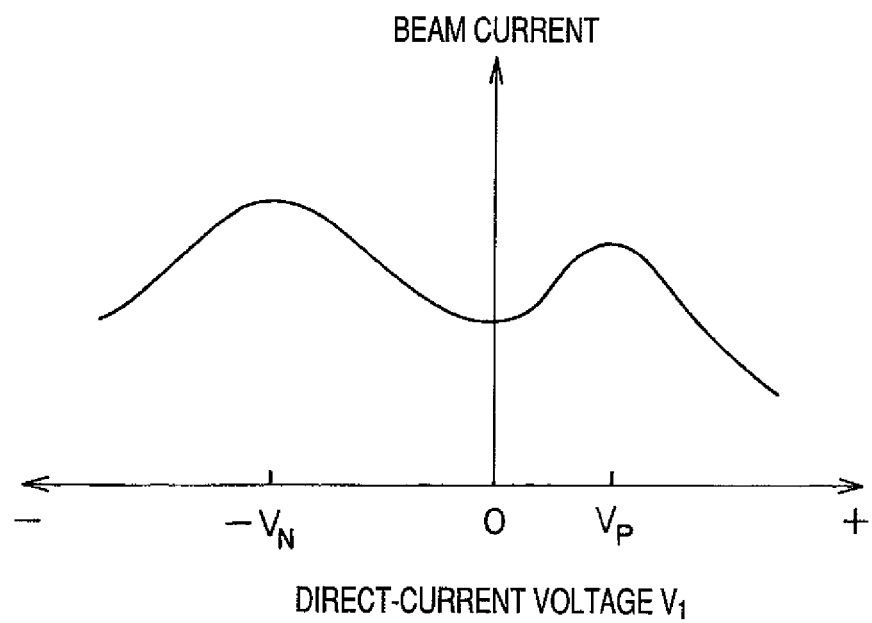
FIG. 7 is a schematic view illustrating change in beam current at a target at the time of changing a direct-current voltage applied to an intermediate electrode of an electric field lens.

FIG. 7 shows a schematic example of change in beam current at the target 24, when the direct-current voltage $V_1$ applied to the intermediate electrode 34 of the electric field lens 30 is changed from negativity to positivity. When the direct-current voltage $V_1$ is in the vicinity of a negative voltage $-V_N$ and in the vicinity of a positive voltage $V_P$, peaks are formed. For example, the voltage $-V_N$ is about $-V_E$ to $-1.5V_E$. For example, the voltage $V_P$ is about $0.5V_E$ to $0.7V_E$.

Accordingly, when a negative direct-current voltage is applied as the direct-current voltage $V_1$ applied to the intermediate electrode 34, the voltage $V_1$ in the range of $-V_N \leq V_1 < 0$ may be used. When a positive direct-current voltage is applied, the voltage $V_1$ in the range of $0 < V_1 \leq V_P$ may be used.

A bipolar voltage source (two-polarity voltage source) capable of continuously outputting a direct-current voltage $V_1$ throughout negative and positive polarities may be used as the direct-current voltage source 38. The direct-current voltage $V_1$ that can be output from the direct-current voltage source 38 may be, for example, in the range of $-V_N \leq V_1 \leq V_P$, and preferably, in the range of $-2V_E \leq V_1 \leq V_E$ allowing a margin therein.

The polarity of the direct-current voltage $V_1$ applied to the intermediate electrode 34 may be separated into positivity and negativity for use depending on the purpose or the like. For example, when a negative direct-current voltage $V_1$ is applied to the intermediate electrode 34, the ion beam 4 is once accelerated between the inlet electrode 32 and the intermediate electrode 34 and has energy higher than the original energy. In the acceleration region, when the ion beam 4 collides with residual gas to generate neutrons (the generation ratio of neutrons is very low because the acceleration region is short), a small amount of neutrons having energy higher than the original energy of the ion beam 4 are generated. The neutrons may be made incident to the target 24. This is called as energy contamination.

When low-energy implantation is performed using a low-energy (e.g., about 10 keV or lower) ion beam 4, particularly, there is a problem of energy contamination of a high-energy component having energy higher than the ion beam 4. Thus, to avoid such a problem, a positive direct-current voltage $V_1$ may be applied to the intermediate electrode 34. However, when a negative direct-current voltage $V_1$ is applied to the intermediate electrode 34, there is an advantage that electrons in plasma generated from a plasma generating device 46 can be pushed back.

When the positive direct-current voltage $V_1$ is applied to the intermediate electrode 34, energy contamination may occur. That is, when the positive direct-current voltage $V_1$ is applied to the intermediate electrode 34, the ion beam 4 is once decelerated between the inlet electrode 32 and the intermediate electrode 34 and has energy lower than the original energy. In the deceleration region, when the ion beam 4 collides with residual gas to generate neutrons (the generation ratio of neutrons is very low, as described above), a small amount of neutrons having energy lower than the original energy of the ion beam 4 are generated. The neutrons may be made incident to the target 24.

When low-energy implantation is performed with energy of about 10 keV or lower, such energy contamination of a low-energy component having energy lower than the energy of the ion beam 4 does not result in a problem as compared with the energy contamination of a high-energy component. However, when the positive direct-current voltage $V_1$ is applied to the intermediate electrode 34, electrons in the plasma generated from the plasma generating device 46 cannot be pushed back, differently from the case of the negative voltage, and the electrons may be pulled into the intermediate electrode 34. It is possible to cope with this by the below-described means.

In consideration of the aforementioned merits and demerits, the polarity of the direct-current voltage $V_1$ applied to the intermediate electrode 34 may be separated into positivity and negativity for use.

Referring to FIG. 1, there provided a preceding-stage multipoint faraday 42 and a later-stage multipoint faraday 44, in which a plurality of detectors for measuring beam current of the ion beam 4 are arranged in the X direction, on the upstream side and the downstream side of the target 24, both multipoint faradays 42 and 44 and a shutter driven in the front thereof in the Y direction are combined for use, similarly with the technique described in Japanese Patent Laid-Open Publication No. 2005-195417, and thus a Y-direction beam size $d_t$ of the ion beam 4 at the position of the target 24 and a Y-direction divergence angle α of the ion beam 4 may be measured by the following equations on the basis of Y-direction beam sizes $d_f$ and $d_b$ of the ion beam 4 at two portions in the Z direction as the traveling direction of the ion beam 4, a distance $L_3$ between both portions, and distances $L_4$ and $L_5$ between both portions and a target. In stead of providing the shutter in front of the preceding-stage multipoint faraday 42, the preceding-stage multipoint faraday 42 may be provided, for example, in the vicinity of the mask 20 on the downstream side, and the preceding-stage multipoint faraday 42 may be driven in the Y direction.

$$d_t=(L_5/L_3)d_f+(L_4/L_3)d_b, \text{ (where } L_3=L_4+L_5) \quad \text{[Equation 1]}$$

$$\alpha=\tan^{-1}\{(d_b-d_f)/2L_3\} \quad \text{[Equation 2]}$$

The direct-current voltage $V_1$ may be feedback-controlled on the basis of the measured data of the beam size $d_t$ and the divergence angle α. For example, when the Y-direction beam size $d_t$ or the divergence angle α of the ion beam 4 is large, the absolute value of the direct-current voltage $V_1$ may be controlled to be large. Accordingly, since the ion beam 4 is strongly narrowed with respect to the Y direction by the electric field lens 30, it is possible to decrease the beam size $d_t$ or the divergence angle α. In this case, it is preferable to preset a range for controlling the direct-current voltage $V_1$, for example, in consideration of the characteristic shown in FIG. 7 (e.g., $-V_N \leq V_1 \leq 0$ when a negative direct-current voltage $V_1$ is used, and $0 < V_1 \leq V_P$ when a positive direct-current voltage $V_1$ is used). In such a case, the control thereof becomes easy. The below-described case of correcting a deviation angle θ is the same.

Figure 8:
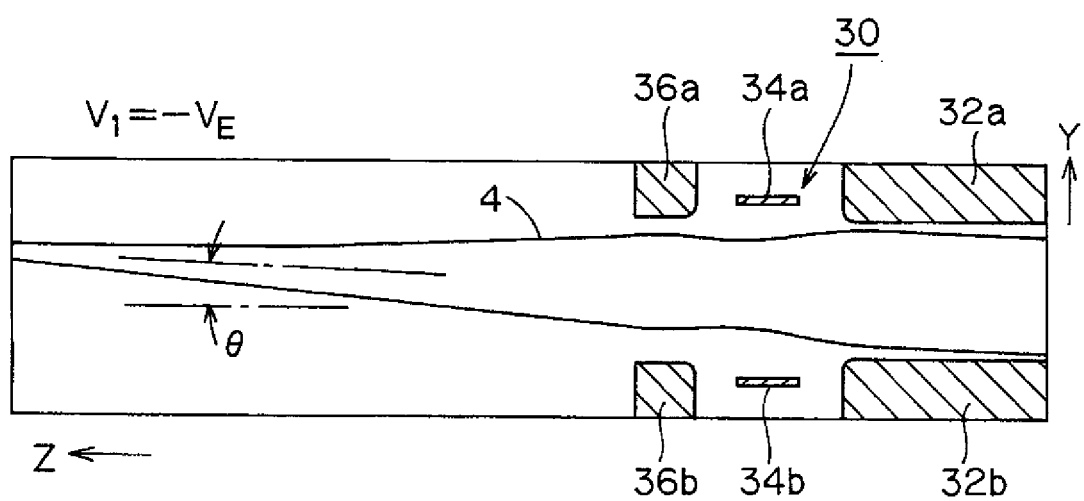
FIG. 8 is a view illustrating an example of a result of simulation in which an ion beam is inclined upward in a Y direction.

When the same direct-current voltage $V_1$ is applied from one direct-current voltage source 38 to a pair of electrodes 34a and 34b constituting the intermediate electrode 34 of the electric field lens 30 and the ion beam 4 made incident to the electric field lens 30 is inclined in the Y direction for some reason as shown in FIG. 8, the ion beam 4 passing through the electric field lens 30 also has a deviation angle θ in the Y direction. The deviation angle θ is an angle formed by a central orbit of the ion beam 4 and a Z-axis direction in the Y-Z plane, more specifically, an angle of the central orbit of the ion beam 4 passing through the electric field lens 30, from the Z direction in the Y-Z plane.

Figure 3:
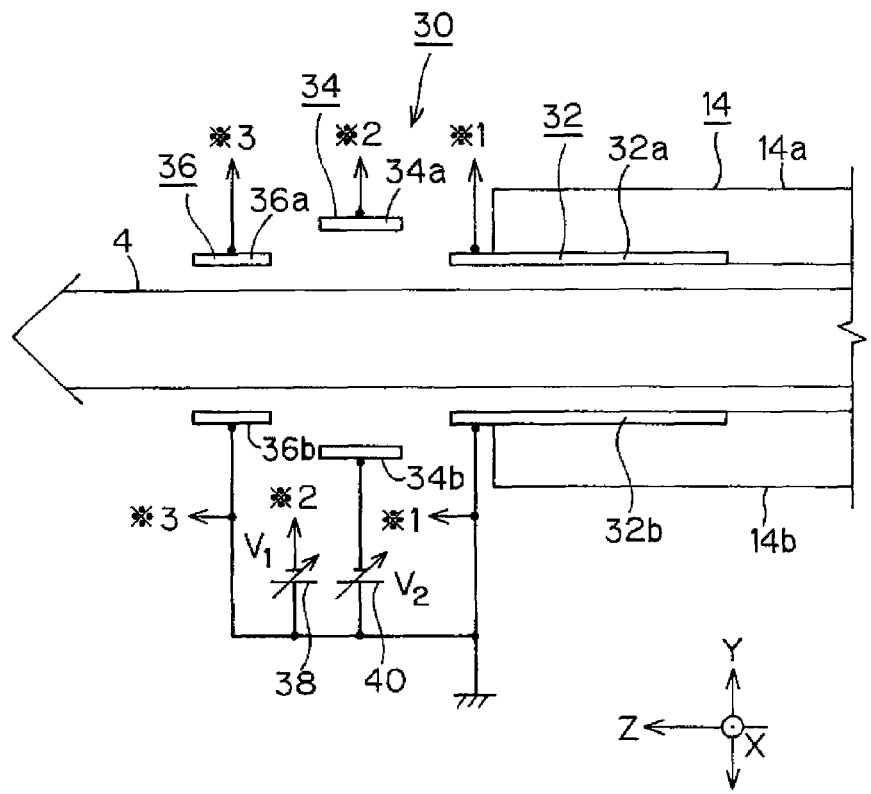
FIG. 3 is a view illustrating another example of a voltage source of an electric field lens, which corresponds to FIG. 2.

Such a problem can be solved, for example, by the embodiment shown in FIG. 3. In the present embodiment, one electrode 34a constituting the intermediate electrode 34 is connected to a first direct-current voltage source 38 for applying a first direct-current voltage $V_1$ thereto, and the other electrode 34b is connected to a second direct-current voltage source 40 for applying a second direct-current voltage $V_2$ thereto.

In the embodiment shown in FIG. 3, negative direct-current voltages $V_1$ and $V_2$ are applied from the direct-current voltage sources 38 and 40 to the electrodes 34a and 34b, respectively. However, as described above, positive direct-current voltages $V_1$ and $V_2$ may be applied to the electrodes 34a and 34b, respectively, reversing the polarities of the direct-current voltage sources 38 and 40. A bipolar voltage source capable of continuously outputting the direct-current voltages $V_1$ and $V_2$ with both of positive and negative polarities may be used as the direct-current voltage sources 38 and 40. The direct-current voltage $V_1$ and $V_2$ applied to the electrodes 34a and 34b, respectively, may be separated into positivity and negativity for use.

Since it is possible to apply the direct-current voltages $V_1$ and $V_2$ different from each other to the pair of electrodes 34a and 34b constituting the intermediate electrode 34 by disposing the first and second direct-current voltage sources 38 and 40, it is possible to adjust the Y-direction deviation angle θ of the ion beam 4.

Figure 9:
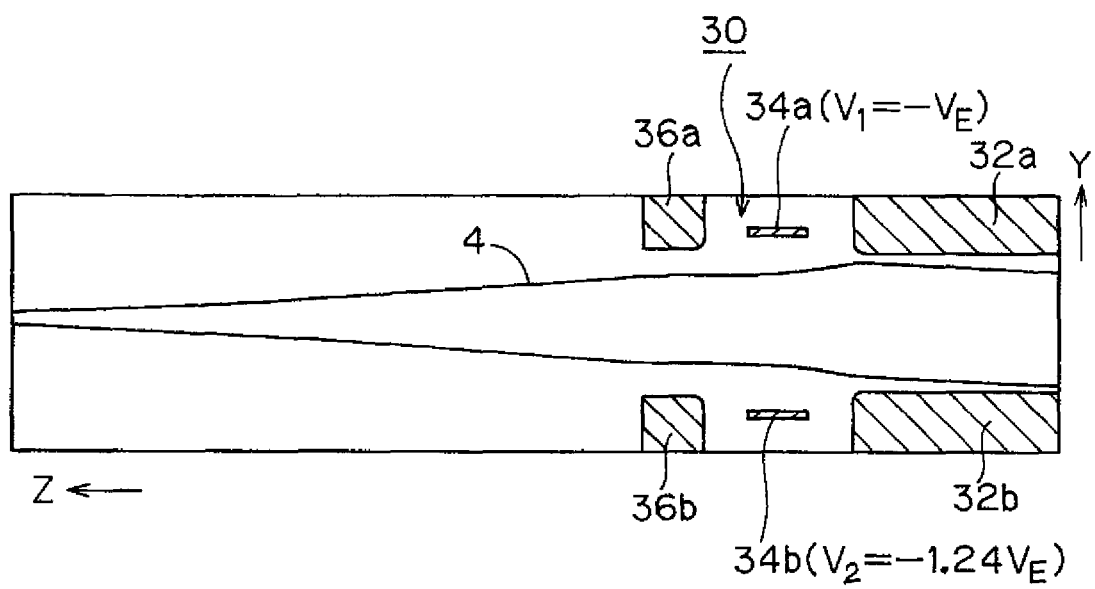
FIG. 9 is a view illustrating an example a result of simulation in which an inclination of an ion beam in FIG. 8 is corrected.

For example, as shown in FIG. 8, when the ion beam 4 is inclined upward in the Y direction, the absolute value of the direct-current voltage $V_2$ applied to the electrode 36b opposite to the inclined side needs to increase larger than the absolute value of the direct-current voltage $V_1$ applied to the electrode 36a close to the inclined side, as shown in FIG. 9. In the present example, direct-current voltages $V_1$ and $V_2$ having values of $-V_E$ and $-1.24V_E$ are applied to the electrodes 34a and 34b, respectively. In FIG. 9, the direct-current voltages $V_1$ and $V_2$ are negative. However, also in case of positive voltages, the same tendency is represented. With such a configuration, it is possible to decrease the deviation angle θ. The deviation angle θ may be reduced substantially to 0 degree.

Using deviation angle measuring means having the aforementioned preceding-stage multipoint faraday 42 and later-stage multipoint faraday 44, similarly with the technique described in Japanese Patent Laid-Open Publication No. 2005-195417, the ion beam is made slowly incident in the Y direction to the multipoint faradays 42 and 44, Y-direction central positions $y_f$ and $y_b$ of the ion beam 4 at two portions in the traveling direction of the ion beam 4 are calculated, and then the deviation angle θ may be measured by the following equations on the basis of both central positions $Y_f$ and $Y_b$ and a distance $L_3$ between both positions.

$$\theta=\tan^{-1}\{(y_b-y_f)/L_3\} \quad \text{[Equation 3]}$$

One of the direct-current voltages $V_1$ and $V_2$ may be adjusted by a feedback control or the like on the basis of the measurement data of the deviation angle θ. For example, the absolute value of the direct-current voltage $V_2$ (or $V_1$) applied to the electrode 34b (or 34a) opposite to the inclined side of the ion beam 4 may be adjusted (controlled) to increase. Accordingly, the orbit of the ion beam 4 passing through the electric field lens 30 may be bent to the opposite side to the originally inclined side, thereby decreasing the deviation angle θ. The deviation angle θ may be reduced substantially to 0 degree.

It is possible to reduce deviation in an incident angle of the ion beam 4 to the target 24 caused by the inclination of the orbit of the ion beam 4 and further an ion implantation angle, by decreasing the deviation angle θ. In addition, since it is possible to prevent the ion beam 4 from colliding with a structure by straightening the orbit of the ion beam 4, it is possible to increase the transport efficiency of the ion beam 4.

In case of providing the mask 20 as the present embodiment, since it is possible to increase the amount of the ion beam 4 passing through the opening 22 of the mask 20, it is possible to increase the transport efficiency of the ion beam 4 from this viewpoint.

It is possible to more raise the aforementioned effect also by reducing the deviation angle θ substantially to 0 degree. That is, it is possible to prevent the deviation of the incident angle of the ion beam 4 and further the ion implantation angle, and it is possible to more increase the transport efficiency of the ion beam 4.

Referring to FIG. 1, as described in Japanese Patent Publication No. 3387488 and Japanese Patent publication No. 3414380, there may be provided the plasma generating device 46 that generates plasma and supplies the plasma to the vicinity of the upstream side of the target 24 to suppress charge of the surface of the target 24 caused by the irradiation of the ion beam. In this case, the electric field lens 30 is disposed preferably on the more upstream side than the plasma generating device 46. That is, the electric field lens 30 is disposed preferably on the downstream side of the beam paralleling device 14 and the upstream side of the plasma generating device 46.

In such a case, electrons generated from the plasma generating device 46 can be supplied to the target 24 without passing through the electric field lens 30. Accordingly, even when the electric field lens 30 is provided, it is easy to decrease the influence on the effect of suppressing the charge of the surface of the target 24 by the plasma generating device 46.

For example, when the direct-current voltages $V_1$ and $V_2$ are negative and the electric field lens 30 is disposed on the down stream side of the plasma generating device 46, the electrons in the plasma generated from the plasma generating device 46 are pushed back by the negative direct-current voltages $V_1$ and $V_2$ applied to the electric field lens 30, and thus it is difficult to reach the target 24. Particularly, since it is preferable that energy of the electrons in the plasma generated from the plasma generating device 46 is low (e.g., about 10 eV or less), the electrons in the plasma is easily pushed back by the negative direct-current voltages $V_1$ and $V_2$.

On the contrary, when the electric field lens 30 is disposed on the more upstream side than the plasma generating device 46 and even when the negative direct-current voltages $V_1$ and $V_2$ are applied to the electric field lens 30, it is not disturbed that the electrons in the plasma generated from the plasma generating device 46 reach the target 24 and further it may be expected to push back the electrons toward the target 24 by the negative direct-current voltages $V_1$ and $V_2$ to help the electrons to reach the target 24. Accordingly, the electric field lens 30 does not disturb the charge suppressing effect of the plasma generating device 46 with respect to the surface of the target 24, and further assistant effect may be expected.

When the direct-current voltages $V_1$ and $V_2$ are positive and even when the electric field lens 30 is disposed on the more upstream side than the plasma generating device 46, it is difficult to expect the effect of pushing back the electrons in the plasma generated from the plasma generating device 46, toward the target 24. The electrons may be pulled into the electric field lens 30 by the positive direct-current voltages $V_1$ and $V_2$.

In such a case, for example, as shown in FIG. 1 by a two-dot-dashed line, there are provided a pair of electrodes 50 opposed to each other in the Y direction with a space for passing the ion beam 4 between the electric field lens 30 and the plasma generating device 46, and a negative voltage is applied from a direct-current voltage source (not shown) to the pair of electrodes 50, and the electrons in the plasma generated from the plasma generating device 46 may be pushed back toward the target 24 by the negative voltage. Since energy of the electrons is low as described above, the voltage to be applied to the electrode 50 may be, for example, in the range about -several tens V to −1 kV. Such an electrode 50 and a direct-current voltage for only it may be provided as necessary.

Differently from the above embodiments, the ion beam deflector separating the ion beam 4 and the neutrons from each other may be a different device from the beam paralleling device making the ion beam 4 parallel. In such a case, the electric field lens 30 may be disposed on the downstream side of the ion beam paralleling device and the downstream side of the ion beam deflector. Generally, since the ion beam deflector is disposed on the downstream side of the beam paralleling device, the electric field lens 30 may be disposed on the downstream side of the ion beam deflector. When the ribbon-shaped ion beam 4 is generated from the ion source 2, the beam paralleling device is unnecessary and thus the electric field lens 30 may be disposed on the downstream side of the ion beam deflector.

Two electric field lenses 30 may be in the traveling direction of the ion beam 4 and the above-described correction of decreasing the deviation angle θ of the ion beam 4 may be performed by cooperation of both electric field lenses 30. Strictly, in case of one electric field lens 30, when the correction of decreasing the deviation angle θ is performed using the electric field lens 30, the central orbit position of the ion beam 4 in the Y direction after the correction of the deviation may be changed by difference of the central orbit direction in the Y direction of the ion beam 4 at the incident time to the electric field lens 30. On the contrary, when the correction of decreasing the deviation angle θ is performed by cooperation of the two electric field lenses 30, (a) it is possible to correct the deviation and further (b) it is possible to regulate the central orbit position in the Y direction of the ion beam 4 passing through the downstream electric field lens 30 in spite of difference in the central orbit direction in the Y direction of the ion beam 4 at the incident time to the upstream electric field lens 30. Further, it is possible to keep the Y direction central position of the ion beam 4 incident to the target 24 substantially regular.

The invention claimed is:

1. An ion implantation apparatus, wherein a traveling direction of an ion beam in a design is a Z direction, and two directions orthogonal to each other in a plane substantially orthogonal to the Z direction are an X direction and a Y direction, which irradiates a target with a ribbon-shaped ion beam having a width in the X direction larger than a width in the Y direction through scanning in the X direction or without scanning in the X direction, and comprises an ion beam deflector which deflects the ion beam in an energy state irradiating the target by a magnetic field or an electric field to separate the ion beam and a neutron from each other, the apparatus comprising:

an electric field lens, which comprises a plurality of electrodes opposed to each other in the Y direction with a space for passing the ion beam between the electrodes, is disposed on a downstream side of the ion beam deflector, and narrows the ion beam in the Y direction, wherein the electric field lens has an inlet electrode, an intermediate electrode, and an outlet electrode, which the electrodes are separately arranged in the traveling direction of the ion beam, each of the inlet electrode, the intermediate electrode, and the outlet electrode includes a pair of electrodes which are opposed to each other in the Y direction with a space for passing the ion beam between the electrodes and are substantially parallel to a plane of the ion beam, and the inlet electrode and the outlet electrode are electrically grounded, and a first direct-current voltage source and a second direct-current voltage source respectively apply independent direct-current voltages to the pair of electrodes of the intermediate electrode.

2. An ion implantation apparatus, wherein a traveling direction of an ion beam in a design is a Z direction, and two directions orthogonal to each other in a plane substantially orthogonal to the Z direction are an X direction and a Y direction, which irradiates a target with a ribbon-shaped ion beam having a width in the X direction larger than a width in the Y direction through scanning in the X direction or without scanning in the X direction, and comprises an ion beam deflector which deflects the ion beam in an energy state irradiating the target by a magnetic field or an electric field to separate the ion beam and a neutron from each other and a mask which is disposed between the ion beam deflector and the target and has an opening for passing the ion beam to form the ion beam, the apparatus comprising:

an electric field lens, which comprises a plurality of electrodes opposed to each other in the Y direction with a space for passing the ion beam between the electrodes, is disposed on a downstream side of the ion beam deflector and an upstream side of the mask, and narrows the ion beam in the Y direction, wherein the electric field lens has an inlet electrode, an intermediate electrode, and an outlet electrode, which the electrodes are separately arranged in the traveling direction of the ion beam, each of the inlet electrode, the intermediate electrode, and the outlet electrode includes a pair of electrodes which are opposed to each other in the Y direction with a space for passing the ion beam between the electrodes and are substantially parallel to a plane of the ion beam, and the inlet electrode and the outlet electrode are electrically grounded, and a first direct-current voltage source and a second direct-current voltage source respectively apply independent direct-current voltages to the pair of electrodes of the intermediate electrode.

3. The ion implantation apparatus according to claim 1, further comprising:

a beam paralleling device which bends the ion beam scanned in the X direction into a parallel beam by the magnetic field or the electric field, wherein the beam paralleling device serves also as the ion beam deflector, and the electric field lens is disposed in a vicinity of an outlet of the beam paralleling device.

4. The ion implantation apparatus according to claim 1, further comprising:

a plasma generating device which generates a plasma, supplies the plasma to a vicinity of the upstream side of the target, and suppresses a charge of a surface of the target by irradiating the ion beam, wherein the electric field lens is disposed on an upstream side of the plasma generating device.

5. A method of correcting a deviation angle of the ion beam in the ion implantation apparatus according to claim 1, the method comprising:

measuring a deviation angle from the Z direction in the Y-Z plane to a central orbit of the ion beam passing through the electric field lens, by a deviation angle measuring means; and adjusting at least one of the direct-current voltages applied from the first direct-current voltage source and the second direct-current voltage source to the pair of electrodes of the intermediate electrode of the electric field lens.

6. The ion implantation apparatus according to claim 2, further comprising:

a beam paralleling device which bends the ion beam scanned in the X direction into a parallel beam by the magnetic field or the electric field, wherein the beam paralleling device serves also as the ion beam deflector, and the electric field lens is disposed in a vicinity of an outlet of the beam paralleling device.

7. The ion implantation apparatus according to claim 2, further comprising:

a plasma generating device which generates a plasma, supplies the plasma to a vicinity of the upstream side of the target, and suppresses a charge of a surface of the target by irradiating the ion beam, wherein the electric field lens is disposed on an upstream side of the plasma generating device.

8. The method of correcting a deviation angle according to claim 5, wherein the measured deviation angle is to be substantially 0 degree.

9. A method of correcting a deviation angle of the ion beam in the ion implantation apparatus according to claim 1, the method comprising:

measuring a deviation angle from the Z direction in the Y-Z plane to a central orbit of the ion beam passing through the electric field lens, by a deviation angle measuring means; and adjusting at least one of the direct-current voltages applied from the first direct-current voltage source and the second direct-current voltage source to the pair of electrodes of the intermediate electrode of the electric field lens.

10. The method of correcting a deviation angle according to claim 9, wherein the measured deviation angle is to be substantially 0 degree.

11. The ion implantation apparatus according to claim 1, wherein the direct-current voltages are negative.

12. The ion implantation apparatus according to claim 2, wherein the direct-current voltages are negative.

* * * * *